United States Patent [19]

Chao

[11] Patent Number: 5,164,235
[45] Date of Patent: Nov. 17, 1992

[54] ANTI-TARNISH TREATMENT OF METAL FOIL

[75] Inventor: Chung-Yao Chao, Hamden, Conn.

[73] Assignee: Olin Corporation, Cheshire, Conn.

[21] Appl. No.: 489,158

[22] Filed: Mar. 6, 1990

[51] Int. Cl.$^5$ ............................................ C23C 26/00
[52] U.S. Cl. ................................... 427/436; 148/258; 148/264; 148/269; 148/282
[58] Field of Search ................ 427/436; 148/258, 264, 148/269, 282

[56] References Cited

U.S. PATENT DOCUMENTS

| | | | |
|---|---|---|---|
| 2,030,601 | 2/1936 | McDonald | 148/6.5 |
| 2,412,543 | 12/1946 | Tanner | 204/35 |
| 2,418,608 | 4/1947 | Thompson et al. | 148/6 |
| 2,647,865 | 8/1953 | Freud | 204/33 |
| 3,625,844 | 12/1971 | McKean | 204/140 |
| 3,677,828 | 7/1972 | Caule | 148/6.15 R |
| 3,716,427 | 2/1973 | Caule | 156/3 |
| 3,764,400 | 10/1973 | Caule | 148/6.16 |
| 3,853,716 | 12/1974 | Yates et al. | 204/28 |
| 3,909,209 | 9/1975 | Kruper et al. | 204/33 |
| 4,070,193 | 1/1978 | Tucker | 156/666 |
| 4,131,517 | 12/1978 | Mitsuo et al. | 204/27 |
| 4,387,006 | 6/1983 | Kajiwara et al. | 204/32 R |
| 4,432,846 | 2/1984 | Honeycutt, III | 204/129.95 |
| 4,468,293 | 8/1984 | Polan et al. | 204/27 |
| 4,515,671 | 5/1985 | Polan et al. | 204/228 |
| 4,532,014 | 7/1985 | Polan | 204/28 |
| 4,549,950 | 10/1985 | Polan et al. | 204/206 |
| 4,568,431 | 2/1986 | Polan | 204/28 |
| 4,647,315 | 3/1987 | Parthasarathi et al. | 148/6.16 |
| 4,952,285 | 8/1990 | Lin | 204/27 |
| 4,961,828 | 10/1990 | Lin | 204/27 |

FOREIGN PATENT DOCUMENTS

| | | |
|---|---|---|
| 2030176 | 7/1978 | United Kingdom. |
| 2073779 | 4/1980 | United Kingdom. |

*Primary Examiner*—Shrive Beck
*Assistant Examiner*—Vi Duong Dang
*Attorney, Agent, or Firm*—Bruce E. Burdick

[57] ABSTRACT

A process for imparting tarnish resistance to copper and copper alloy materials, particularly copper foil. The material is first treated with an acidic chromium-containing solution to deposit chromium ions on said foil. Thereafter the material is treated with a basic zinc ion containing solution to deposit zinc ions thereon. Finally, the material is rinsed in distilled water to remove any residual basic solution.

15 Claims, No Drawings

ANTI-TARNISH TREATMENT OF METAL FOIL

The present invention relates broadly to the treating of metal foil to form a tarnish and oxidation resistant film thereon. More specifically, the present invention relates to the treatment of copper and copper base alloy foil materials to prevent tarnish.

Copper and copper base alloy foils are widely used for printed circuit applications. The foil is produced to a thickness of under 0.006 inches and more generally to a thickness in the range of about 0.0002 inches (known in the art as ⅛ ounce copper foil) to about 0.0028 inches (known in the art as 2 ounce copper foil). The foil is commonly produced by one of two methods. "Wrought" foil is produced by mechanically reducing the thickness of a copper or copper alloy strip by a process such as rolling. "Electrodeposited" foil is produced by electrolytically depositing copper ions on a rotating cathode drum and then peeling the deposited strip from the drum.

In printed circuit applications, the foil is bonded to a dielectric substrate. This substrate is typically a polyimide such as KAPTON manufactured by DuPont or FR-4 (a fire retardant epoxy). The copper foil layer is laminated to the dielectric layer through the use of heat and pressure. A pressure of about 300 psi at a temperature of about 175° C. for a time up to 30 minutes will provide suitable adhesion between the layers.

To maximize the adhesion between the copper foil layer and the dielectric support layer, it has been found desirable to roughen the surface of the foil which contacts the dielectric layer prior to bonding. While there are a variety of techniques available to roughen or treat the foil surface to improve adhesion, one of the most commonly used involves the formation of a plurality of copper or copper oxide nodules or dendrites on the foil surface. U.S. Pat. Nos. 4,468,293 and 4,515,671 both to Polan et al illustrate such dendritic or nodular roughening treatments.

One problem facing manufacturers and users of both electrolytic and wrought copper and copper alloy materials is the tarnishing of these materials during storage and shipment. This tarnishing generally results from the exposure of the copper foil to normal atmospheric conditions and during elevated temperature lamination. Not only is the tarnishing aesthetically unpleasant, it is also a potential source of problems during the manufacture of many products such as printed circuit board. For example, the tarnishing of copper foil prior to its lamination to a dielectric substrate can affect both the bond strength between the foil and the substrate and the etching characteristics of the resultant laminate.

In the past, tarnish resistance has been imparted to copper and copper base alloy materials by immersion in an electrolyte containing chromate ions. U.S. Pat. No. 3,625,844 to McKean, describes a method of anti-tarnishing or stain-proofing copper foil involving the electrolytic treatment of the foil in an aqueous electrolyte under critical conditions of hexavalent chromium ion concentration, cathode current density, and treatment time.

U.S. Pat. No. 3,853,716 to Yates et al, discusses the McKean process and points out that it is not a completely satisfactory anti-tarnishing technique due to a build-up of copper and chromium cations in the electrolyte bath. The cations interfere with the effectiveness of the stain proofing. Yates et al attempt to overcome this problem by rendering the copper material cathodic as it passes through an aqueous electrolyte containing hexavalent chromium ion containing anions and being of sufficient alkalinity to cause precipitation of copper and chromium cations.

U.S. Pat. Nos. 4,131,517 to Mitsuo et al and 4,387,006 to Kajiwara et al illustrate still other chromate-containing treatments for suppressing time dependent changes in color tone during storage. Still other anti-tarnishing or stain-proofing techniques are illustrated in United Kingdom published patent applications 2,030,176A and 2,073,779A.

Solutions of phosphoric acid, chromic acid and/or their salts have also been applied to various materials in an attempt to impart tarnish and corrosion resistance. U.S. Pat. Nos. 3,677,828, 3,716,427 and 3,764,400, all to Caule, illustrate the use of phosphoric acid solutions to improve the tarnish resistance of copper and copper-based alloys. Caule also describes in his '400 patent the use of a caustic rinse solution after application of his phosphoric acid treatment. U.S. Pat. No. 4,647,315 to Parthasarathi et al discloses a dilute aqueous chromic acid-phosphoric acid solution.

Phosphoric and/or chromic acid solutions have also been applied to zinc, zinc coated articles and aluminum foil and articles. U.S. Pat. Nos. 2,030,601 to McDonald, 2,412,543 to Tanner, 2,418,608 to Thompson et al, 2,647,865 to Freud and 4,432,846 to Honeycutt, III, illustrate some of the applications of phosphoric-chromic acid solution.

Any anti-tarnish coating applied to the copper or copper alloy foil must be removed following lamination of the foil to the substrate so that the underlying copper foil may be etched into a desired circuit pattern. In the manufacture of circuit boards, circuit traces are patterned into the copper foil by photolithography as known in the art.

The unbonded side of the copper foil is coated with a photo-sensitive chemical resist. The resist is exposed to a developer such as ultraviolet light exposed through a mask containing the desired circuit pattern. Dependent on whether the photoresist is that known in the art as "positive" resist or "negative" resist, the image may be either a desired circuit pattern, or the negative image. After exposure, the unexposed portion of the photoresist is removed by rinsing with an appropriate solvent to expose the underlying foil. The circuit board is then immersed in a suitable etchant to remove the exposed copper. After etching and rinsing, the remaining photoresist is removed by a solvent wash. The dielectric substrate is unaffected by the solvent and etchant. The substrate remains intact and the copper foil layer is patterned into a desired configuration of circuit traces.

If during the subsequent processing, the anti-tarnish treatment is not completely removed, it may interfere with the etching step during photolithography resulting in incomplete etching and the potential for electric short circuit. In the case where the laminated foil is used in photoresist applications, it is desired to use only a mild chemical cleaning procedure. One such cleaning procedure utilizes a chemical solution comprising four percent by volume hydrochloric acid in water to remove the anti-tarnish coating. It has been found that many of the prior art anti-tarnish coatings are not removed by this four percent HCl solution and may require mechanical abrasion or other invasive techniques. This may result in only partial removal of the anti-tarnish layer or an inordinately long process time. It is known in the art that a coating of chromium and zinc is capable of fulfilling the requirements for tarnish resistance and also is readily removed by weak acid treatment such as a four percent HCl solution.

Accordingly, it is an object of the present invention to provide a process for applying an anti-tarnish coating to the surface of a copper or copper alloy foil which provides a satisfactory anti-tarnish coating and which is also easily removed with a weak acid solution.

More specifically, it is an object of the present invention to provide a method of providing a chromium-zinc coating on the surface of a copper or copper alloy foil to provide an anti-tarnish coating.

These and other objects of the present invention may be accomplished through the provision of a process for imparting a tarnish-resistance to a copper or copper alloy foil which includes treating the foil with an acidic chromium-containing solution to deposit chromium ions on the foil. Thereafter, the foil is treated with a basic zinc ion-containing solution to deposit zinc ions on the foil. The foil is then rinsed to remove the residual caustic solution.

The present invention involves an improved non-electrolytic technique for providing copper and copper alloy foil materials with an anti-tarnish coating. As used herein, the term copper and copper alloy foil includes copper and copper base alloy sheet, strip, foil and slab materials.

The present invention is particularly adapted for treating copper foil which may comprise any electrodeposited or wrought copper or copper alloy foil. When the foil is to be used for a printed circuit application, one surface of the foil may be treated to roughen the surface to improve the adhesion properties of the foil. While any suitable treatment known in the art may be used to enhance the foil adhesion properties, it is preferred to electrolytically form a plurality of dendrites on the surface to be bonded to a substrate. Generally, the dendritic particles are formed in an electrolytic technique by immersing the copper or copper alloy foil in an aqueous electrolyte solution such as an aqueous sulfuric acid-copper sulfate solution and applying a cathodic current to the coil. Prior to forming the dendrites, the copper or copper alloy foil may be cleaned and/or have a copper strike layer formed thereon. The copper strike layer is applied where it is desirable to render the foil more electrochemically active and receptive to the subsequent roughening treatment. It has been discovered that by using a copper strike layer, the number of unplated zones on the foil may be significantly reduced after the dendritic treatment. U.S. Pat. Nos. 4,468,293 and 4,549,950, to Polan et al, which are hereby incorporated by reference herein in their entirety, illustrate suitable techniques for roughening wrought copper or copper alloy foil surfaces and preparing the copper or copper alloy foil for use in printed circuit applications.

Upon completion of the roughening treatment, the treated foil is subjected to a wash to remove any unwanted impurities, loose particles and potential solution contaminants. The wash may comprise any suitable rinse treatment known in the art. If desired, the treated foil may be dried after washing and before application of the anti-tarnishing treatment of the present invention. Any suitable drying technique known in the art such as infra-red lamps or heated air may be used to dry the treated foil.

In accordance with the present invention, the copper or copper alloy foil is rendered tarnish resistant by a three-step process which involves treating the foil with an acidic chromium-containing solution to deposit chromium ions on the foil, thereafter treating the foil with a basic zinc ion containing solution to deposit zinc ions thereon, and thereafter rinsing the foil to remove the caustic solution. An advantage to the present treatment is that the desired tarnish and oxidation resistance may be imparted to the copper or copper alloy foil without applying electric current during treatment to either the foil or the anti-tarnish solution. Additionally, the anti-tarnish treatment is removable from the foil by conventional cleaning procedures such as immersion in HCl at room temperature to permit further processing of the foil.

In accordance with the present invention, the foil is first treated by immersion in an acidic chromium-containing solution. This solution may comprise an aqueous solution of chromic acid and sulfuric acid. Preferably, the chromic acid is present in an amount of about 0.1 to about 10 grams per liter and the sulfuric acid is present in the amount of 0.01 to 0.5 grams per liter. The temperature of the solution during treatment may be from about room temperature to about 100° C and preferably from about 40° C to about 70° C. The time of treatment or immersion of the foil in the solution may be from about one second to about five minutes, and preferably from about 10 seconds to about 40 seconds.

After the treatment with the chromium-containing solution, the foil is then treated with a basic solution containing a zinc cation. This is accomplished preferably by immersing the foil in an aqueous solution containing a source of zinc ion and a basic material, preferably sodium hydroxide or potassium hydroxide or mixtures thereof. The zinc may be in the form of pure zinc, zinc oxide, or zinc sulfate. Preferably the zinc is in the form of zinc oxide and may be present in the solution from about three grams per liter up to the solubility of the zinc oxide in the hydroxide. If the zinc is in other forms, the amount should be adjusted accordingly to provide an equivalent amount of zinc. The sodium hydroxide or potassium hydroxide may be present in the solution in the amount of from about 50 grams per liter to about 500 grams per liter. The temperature of the zinc-containing basic solution may be from about room temperature up to about 35° C. The time of immersion may be from one second to about five minutes, and preferably from about 10 seconds to about 40 seconds.

While the acidic chromium-containing solution and the basic zinc ion containing solution may be applied to the foil in any suitable manner including brushing or spraying, it is preferred to treat the foil by passing an elongated sheet of foil through individual tanks containing the respective solutions to immerse the foil in the solutions. Each of the tanks may be formed from any suitable material and may have appropriate inlet(s) and outlet(s) for adding and withdrawing the solutions. The tanks may be provided with any suitable means known in the art such as heating/cooling loops for maintaining the solution at the desired temperature. A plurality of rolls may be mounted to and in a tank to define the path by which the foil tracks through the tank.

After the application of the above two solutions, the foil is rinsed to remove the residual caustic solution from the prior treatment. Preferably, the foil is rinsed by immersion in distilled water at room temperature for a time sufficient to remove the treatment solution. Such time may vary from about 15 seconds to about 45 seconds and preferably is for about 30 seconds.

By way of example, a piece of wrought copper foil (two inches by six inches), having a dendritic copper treatment as described above on one side thereof was first immersed in a solution of chromic acid and sulfuric acid. The mixture contained 0.2 grams per liter of chromic acid and 0.05 grams per liter of sulfuric acid. The solution was maintained between 50° C. and 60° C. and the foil was immersed in the solution for 25 seconds. Thereafter, the foil was then immersed in a solution containing zinc oxide and sodium hydroxide. The solution contained 8.5 grams per liter zinc oxide and 100 grams per liter sodium hydroxide. The solution was maintained at room temperature and the foil was immersed for 25 seconds. The foil was then rinsed with distilled water for 30 seconds at room temperature.

The treated foil was then subjected to 190° C×30 minute air bake test for tarnish resistance evaluation. After the test, no discoloration of the foil was observed thereby indicating that the treatment provided tarnish resistance. Afterward, part of the same foil was subject to a weak acid cleanability test which consisted of cleaning the foil at room temperature in a 4 volume percent HCl solution for 30 seconds. This foil was then exposed to $(NH_4)_2S$ fume for 15 seconds. The cleaned surface of the foil readily tarnished upon exposure to the ammonium sulfate fume whereas the uncleaned portion of the foil did not tarnish thereby indicating good acid cleanability.

The U.S. patent and foreign patent documents described in the specification are intended to be incorporated by reference herein in their entirety.

It is apparent that there has been provided in accordance with this invention an anti-tarnishing technique for use with copper foil which fully satisfies the objects, means and advantages set forth above. While the invention has been described in combination with a specific embodiment hereof, it is evident that many alternatives, modifications and variations will be apparent to those skilled in the art in light of the foregoing description. Accordingly, it is intended to embrace all such alterations, modifications and variations fall within the spirit and scope of the appended claims.

What is claimed is:

1. A process for imparting a tarnish resistance to copper and copper alloy material comprising:
   non-electrolytically treating said material with an acidic chromium-containing solution to deposit chromium ions on said material, thereafter
   non-electrolytically treating said material with a basic zinc ion containing solution to deposit zinc ions thereon, and thereafter,
   rinsing said material to remove the residual basic solution.

2. The process of claim 1 wherein said acidic chromium-containing solution comprises an aqueous solution of chromic acid and sulfuric acid.

3. The process of claim 1 wherein said basic zinc solution comprises an aqueous solution of a source of zinc ions and a material selected from the group consisting of sodium hydroxide and potassium hydroxide and mixtures thereof.

4. The process of claim 1 wherein said treating said material with an acidic chromium-containing solution comprises immersing said material in an aqueous solution containing chromic acid and sulfuric acid at a temperature of from about room temperature to about 100° C., said acidic chromium-containing solution containing from about 0.1 to about 10 grams per liter chromic acid and from about 0.01 to about 0.5 grams Per liter sulfuric acid, and said treating with said basic zinc ions containing solution comprises immersing said material in an aqueous solution containing a source of zinc ion and a hydroxide material selected from the group consisting of sodium hydroxide and potassium hydroxide and mixtures thereof.

5. The process of claim 4 wherein said source of zinc ion is selected from the groups of zinc, zinc oxide and zinc sulfate.

6. The process of claim 4 wherein said basic zinc ion containing solution contains zinc oxide, said zinc oxide being present in the amount of from about 3 grams per liter to the solubility of said zinc oxide in the hydroxide, said hydroxide material being present in the amount of from about 50 to about 500 grams per liter.

7. The process of claim 6 wherein said material is immersed in said chromium-containing solution for about one second to about five minutes at a temperature of from about room temperature to about 100° C, and is immersed in said zinc ion containing solution for about one second to about five minutes at a temperature of from about room temperature to about 35° C.

8. The process of claim 7 wherein said immersion in said chromium-containing solution is for about 10 seconds to about 40 seconds at a temperature of about 40° C. to about 70° C., and said immersion in said zinc ion containing solution is for about 10 seconds to about 40 seconds.

9. A process for imparting a tarnish resistance to copper and copper alloy foil comprising:
   non-electrolytically treating said foil with an aqueous solution containing chromic acid and sulfuric acid to deposit chromium ions thereon, thereafter
   non-electrolytically treating said foil with an aqueous solution of a source of zinc ions and a material selected from the group consisting of sodium hydroxide and potassium hydroxide and mixtures thereof to deposit zinc ions thereon, and thereafter
   rinsing said foil with water to remove any residual solution.

10. The process of claim 9 wherein said treating with said aqueous solution of chromic acid and sulfuric acid comprises immersing said foil in an aqueous solution containing from about 0.1 to about 10 grams per liter chromic acid and from about 0.01 to about 0.5 grams per liter sulfuric acid at a temperature of from about room temperature to about 100° C.

11. The process of claim 10 wherein said treating with said aqueous solution of a source of zinc ions comprising immersing said foil in said solution, said zinc ion containing solution containing from about 50 to about 500 grams per liter of a material selected from the group consisting of sodium hydroxide and potassium hydroxide and mixtures thereof and said zinc being present in an amount equivalent to the use of zinc oxide in the amount of from about 3 grams per liter to the solubility of zinc oxide in said hydroxide material.

12. The process of claim 10 wherein said zinc ion source is selected from the group consisting of zinc, zinc oxide and zinc sulfate and mixtures thereof.

13. The process of claim 12 wherein said material is immersed in said chromic acid/sulfuric acid solution for about one second to about five minutes at a temperature of from about room temperature to about 100° C., and is immersed in said zinc ion containing solution for about one second to about five minutes at a temperature of from about room temperature to about 35° C.

14. The process of claim 13 wherein said immersion in said chromic acid/sulfuric acid solution is for about 10 seconds to about 40 seconds at a temperature of about 40° C. to about 70° C., and said immersion in said zinc ion containing solution is for about 10 seconds to about 40 seconds.

15. The process of claim 14 wherein said source of zinc ion is zinc oxide.

* * * * *